(12) United States Patent
McNie

(10) Patent No.: US 6,846,426 B1
(45) Date of Patent: Jan. 25, 2005

(54) FORMATION OF A BRIDGE IN A MICRO-DEVICE

(75) Inventor: Mark E. McNie, Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/786,813

(22) PCT Filed: Sep. 13, 1999

(86) PCT No.: PCT/GB99/03026
§ 371 (c)(1),
(2), (4) Date: Mar. 9, 2001

(87) PCT Pub. No.: WO00/16105
PCT Pub. Date: Mar. 23, 2000

(30) Foreign Application Priority Data

Sep. 12, 1998 (GB) .............................. 9819817

(51) Int. Cl.$^7$ .................. B23P 5/000; C03C 25/000; C23F 1/000
(52) U.S. Cl. .............................. 216/39; 216/41; 216/83
(58) Field of Search .......................... 216/83

(56) References Cited

U.S. PATENT DOCUMENTS

| | | | | |
|---|---|---|---|---|
| 3,560,893 A | * | 2/1971 | Wen ........................ 333/24.1 |
| 4,289,846 A | * | 9/1981 | Parks et al. ................ 430/314 |
| 4,851,080 A | * | 7/1989 | Howe et al. ................ 156/647 |
| 4,945,069 A | | 7/1990 | Carter |
| 4,997,521 A | | 3/1991 | Howe et al. |
| 5,275,973 A | * | 1/1994 | Gelatos ..................... 438/623 |
| 5,324,553 A | * | 6/1994 | Ovshinsky et al. ......... 427/571 |
| 5,324,683 A | | 6/1994 | Fitch et al. |
| 5,345,824 A | * | 9/1994 | Sherman et al. ......... 73/514.18 |
| 5,364,497 A | * | 11/1994 | Chau et al. ................. 216/39 |
| 5,427,975 A | * | 6/1995 | Sparks et al. ................ 437/79 |
| 5,620,933 A | * | 4/1997 | James et al. .................. 216/2 |
| 5,635,739 A | * | 6/1997 | Grieff et al. ................ 257/254 |
| 5,656,123 A | * | 8/1997 | Salimian et al. ....... 156/345.43 |
| 5,665,632 A | | 9/1997 | Lur et al. |
| 5,686,743 A | | 11/1997 | Lammert |
| 5,725,729 A | * | 3/1998 | Greiff ..................... 156/657.1 |
| 5,738,757 A | * | 4/1998 | Burns et al. ................ 438/603 |
| 5,747,353 A | * | 5/1998 | Bashir et al. ................ 438/50 |
| 5,798,283 A | * | 8/1998 | Montague et al. ........... 438/24 |
| 5,817,446 A | * | 10/1998 | Lammert ................... 430/315 |
| 5,871,655 A | * | 2/1999 | Lee et al. ..................... 216/22 |
| 5,885,124 A | * | 3/1999 | Hattori ........................ 445/24 |

FOREIGN PATENT DOCUMENTS

| | | |
|---|---|---|
| EP | 0 451 992 | 10/1991 |
| EP | 0 582 797 | 2/1994 |

OTHER PUBLICATIONS

European Search Report dated Jul. 21, 2004.

\* cited by examiner

*Primary Examiner*—Parviz Hassanzadeh
*Assistant Examiner*—Karla Moore
(74) *Attorney, Agent, or Firm*—Nixon & Vanderhye P.C.

(57) ABSTRACT

A method of micro-machining comprising providing a primary region of at least a first material which contacts a second material at at least one end portion thereof, the method comprising providing an infill material on to the second material, patterning and etching said infill material to form a hole through the infill material to the second material, depositing the first material on to said infill material so that the at least one portion of the first material contacts the second material through the hole. The method can be used to provide a track bridging suspended portions of micro-machined structures. Also a method of narrowing and sealing top portions of channels cut into a wafer is disclosed.

23 Claims, 5 Drawing Sheets

FORMATION OF A BRIDGE IN A MICRO-DEVICE

This application is the US national phase of international application PCT/GB99/03036 filed Sep. 13, 1999, which designated the U.S. and claims the priority benefit of GB 9819817.9, dated Sep. 12, 1998, the entire contents of which are hereby incorporated by reference.

BACKGROUND OF THE INVENTION

1. Field of the Invention

This invention relates to improvements in micro-machining.

2. Discussion of Prior Art

Micro machining of materials to form structures therein is known. Indeed, sensors have been fabricated using micro machining techniques for a number of years. However, it has been a problem in previous sensors to connect electrically certain portions of sensors so formed to the remainder of the sensor.

In particular some designs of sensor have portions which are freely suspended in relation to the remainder of the sensor or wafer. Such device suspended portions have previously prevented electrical conductors from passing across that region of the sensor.

SUMMARY OF THE INVENTION

According to a first aspect of the invention there is provided a method of micro-machining comprising providing a primary region of at least a first material which contacts a second material at at least one end portion thereof, the method comprising providing an infill material on to the second material, patterning and etching said infill material to form a hole through the infill material to the second material, depositing the first material on to said infill material so that the at least one portion of the first material contacts the second material through the hole.

Such a method is advantageous because it allows features of the second material to be jumped over, or bridged, by the primary region of first material. For example the method could be used to jump over channels in the second material or may be channels in a material other than the second material. In one embodiment the method is particularly attractive simplifying the release process for device suspended portions and allows isolated/suspended structures to be contacted with a track. The method may be particularly applicable to Silicon on Insulator High Aspect Ratio Micromachining (SOI HARM).

The first material may be conductive and the primary region of first material may form a track. Such a method may be suitable for providing conductive tracks.

The method may comprise removing the infill material and as such a portion of the primary region (primary region suspended portion) may become substantially freely suspended, possibly above the second material. Alternatively, or additionally, at least a portion of the primary region may be freely suspended relative to another material, possibly relative to device suspended portions. In an alternative, or additional, method the infill material may be left in place and not removed. This may allow areas separated by channels to be connected by conductive tracks, etc. In some embodiments the method may be such that a number of primary regions are formed which may be freely suspended or remain in contact with the infill material.

The primary region may be formed from a plurality of materials, possibly provided in layers. A structural layer may be provided which may support a conductive layer. The structural layer may be chosen for its mechanical properties. For instance the structural layer may be a substantially stress free nitride. A plurality of conductive layers may be provided separated by substantially insulating material.

The method may be applicable to micro-machined structures wherein a substrate is etched to form device suspended portions substantially free from the bulk of the substrate, there being channels separating the device suspended portion from the bulk of the substrate. In which case the method may allow a channel, or may allow a plurality of channels, to be bridged by the primary region, or indeed may allow device suspended portions to be bridged by the primary region. The skilled person will appreciate that the device suspended portions may be connected to the bulk of the substrate with linking portions preventing the device suspended portions from becoming separated from the bulk of the substrate. Further, the substrate may be the second material.

The second material may be silicon or may be another semi-conductor. Alternatively, the second material may be another material capable of being micro-machined. For example the second material may be a metal or quartz. The skilled person will appreciate that the primary region could be made to contact a layer associated with a substrate. For example the second material may be a metal layer arranged in association with a silicon substrate. Alternatively, the second material may be a substrate.

In one embodiment the method can be used to join a conducting layer within a pre-formed integrated microelectronic circuit or device to the primary region wherein the conducting layer is the second material.

The channels may have a width of up to about 1 mm. Conveniently the channels may have a width of up to substantially 100 $\mu$m. In other embodiments the width of the channel is up to substantially 50 $\mu$m. The channel may have a width of up to substantially 10 $\mu$m.

Previously to bridge a channel using micro-machining techniques, the channel has been completely refilled by the deposition of a material and metalisation placed across the surface of the refilled channel in a high temperature process. Generally the channel was left filled with the material and therefore such prior art methods have not been able to bridge device suspended portions.

The infill material may be provided at top surface portions of the second material and not penetrate into to substantially all of the channels.

The primary region may contact the device suspended portions through the holes in the infill material.

It will be appreciated that when using micro-machining techniques to fabricate devices with device suspended portions that an etch (a sacrificial etch) is often used to release the device suspended portion from the bulk of the material. In most cases a sacrificial etch may remove a sacrificial material which may be the layer of insulator from between two wafers in a silicon on insulator (SOI) wafer. Prior art techniques for refilling channels and providing metalisation across the surface have necessarily been performed before the sacrificial etch. The present method may be performed after the device suspended portion has been released from the bulk of the material (that is after the sacrificial etch).

The device suspended portions described in this specification may be provided by two alternative processes. Firstly, it is possible to substantially release the device suspended portions using sacrificial techniques wherein a material other than the substrate is etched (or sacrificially etched) to substantially release the device suspended portions. One such example would be using SOI (silicon on insulator) wafers wherein the insulating layer is sacrificially etched to substantially release the device suspended portions. Secondly, it may be possible to substantially release the device suspended portions by, etching the substrate itself using traditional bulk micro-machining techniques.

Alternatively, or additionally, the method may be performed before the sacrificial etch is performed. If the method is performed before the sacrificial etch, the method may include the step of protecting the infill material from the sacrificial etch. This protection may include the step of covering the infill material and/or the primary region with a protective layer.

Further, if the method is performed before the sacrificial etch the method may comprise using a material for the primary region which is not etched in the sacrificial etch. The first material may be TiW. TiW is advantageous because it is not etched in HF acid, a common etchant in micro-machining techniques.

The primary region suspended portion may have a length of under substantially 100 $\mu$m. The primary region suspended portion may have a length of substantially under 50 $\mu$m. Indeed, the primary region suspended portion may have a length of under substantially 10 $\mu$m. Having a portion with such dimensions is advantageous as it produces a primary region suspended portion which is freely suspended and which can resist movement when external forces (for example acceleration) are applied. Should the primary region suspended portion comprise a track and move when such forces are applied the stray capacitances of the system in which the track is provided would be altered, perhaps affecting the performance of the system. Further the primary region may eventually suffer fatigue and fail. The skilled person will appreciate that the stiffness of the primary region suspended portion is not only a function of its length but also a function of its material, and its cross section.

Particular advantages of the method are that it is realisable at low temperatures and is thus suitable for post processing wafers with preformed integrated micro-electronic circuits (which may be CMOS). Of course, the skilled person will appreciate that high temperature processes could also be used to perform the method but then the method would not be compatible with CMOS circuits. In particular the infill material may be a thermally grown oxide, nitride, or oxynitride, or may be a deposited oxide, nitride, oxynitride or polysilicon for example. These material may be deposited by process such as TEOS, LPCVD.

The infill material may be provided as a plurality of layers, perhaps of different materials. There may be a plurality of conducting layers. In particular layers of the infill material may be chosen to reduce the stresses within the infill material. In one embodiment the infill material is provided as a series of doped and undoped layers of an oxide. Other embodiments are also possible.

The first material may be a metal, or a semi-conductor, or other material. For instance the first material may be any one of the following materials: aluminium, aluminium copper, aluminium silicon, polysilicon, TiW, Ti, tungsten, aluminium silicon copper.

The channel may be refilled with a low temperature deposited material in a deposition process. In the preferred embodiment the channel may be partially refilled, and may be refilled at upper regions and not refilled at lower regions. The deposited material may be deposited using Plasma Enhanced Chemical Vapour Deposition (PECVD). The deposited material may be an oxide or may be a nitride. It is advantageous to use a low temperature process so that the method is compatible with processes used to fabricate CMOS devices and also can be used to modify devices on commercially procured CMOS wafers. The use of high temperatures would be likely to severely degrade of render inoperational any CMOS circuits already fabricated in the second material if metallised or degrade device characteristics if not.

By low temperature process it is meant a temperature wherein integrated micro electronic devices (perhaps CMOS devices) are not damaged, perhaps by degradation of the metallic interface states. Such a temperature may be below substantially 450° C. It will be appreciated that if no metal is provided the structure the interface states cannot be damaged and as such the integrated micro electronic devices may be damaged by migration of the dopants within doped regions which form the devices. Such damage may occur above temperatures of substantially 700° C.

The skilled person will appreciate that during standard PECVD the plasma is generated at a single frequency. It may be possible to substantially completely fill the channels, for example by using a dual frequency PECVD system wherein the plasma is generated at a first frequency and species accelerated toward the second material (or the material in which the channel is provided should the second material be a layer associated with a substrate, etc.) at a second frequency. The dual frequency PECVD system may increase the depth to which the channels are filled.

It will be appreciated that during the sacrificial etch to release the device suspended portions, portions below a predetermined size will be freed from the bulk of the material (perhaps the second material). If it is not desired to release certain portions from the bulk of the material it may be possible to adhere the device suspended portions to the bulk of the material using the dual frequency PECVD wherein the channels are substantially completely refilled.

The skilled person will appreciate that the sacrificial etch is one way of freeing the device suspended portion and any other way of freeing the device suspended portion is also considered. Protection is sought for methods that use any technique of freeing the device suspended portions.

The deposition process may deposit material in a top region of the channel. The material may be deposited in only a top region with substantially no material being deposited in a bottom region of the channel. The deposited material may expand laterally across the channels and may eventually cap the channel so sealing the channel at the top region.

An etching process (or other material removal process) may be used to remove the infill material. For example ion beam milling, spark erosion or other precise material removal technique may be suitable.

Alternatively, the infill material may be planarised or thinned using techniques such as a chemical mechanical polishing or dry or wet etching.

The primary region may be fabricated from a material which has a substantially zero (or may be low) removal rate in the material removal technique used to remove the infill material.

Channels filled by the infill material may have a depth of up to substantially 2 mm.

The infill material may have a deposited thickness of up to substantially 20 $\mu$m above the second material. The infill material may have a maximum deposited thickness of up to substantially 15 $\mu$m. In the one embodiment the infill material may have a deposited thickness of up to substantially 5 $\mu$m.

In another embodiment the infill material may be a polymer material. For example the infill material may be a polyimide. Specifically, the polyimide may be PIQ™. In a further embodiment the infill material may be a photoresist. If the infill material is suitable, for example a polymer, polyimide or photoresist, it may be flowed onto the second material so that it flows into any channels. This has the advantage that the polymer, polyimide or photoresist displaces any liquids which were present in the channel. Other materials suitable for spinning onto a wafer may be used as the infill material. For instance spin on dielectrics/insulators such as spin on glasses, or sol gels could be used. (Indeed any suitable spin on di-electric may be used).

The skilled person will appreciate that when a polymer material is used it may not fully flow into the channels and this may depend on the viscosity of the polymer. It will be appreciated that as the viscosity increases should the substrate be spun to planarise the polymer, etc. that there is less of a likelihood of the polymer, etc. being forced out of the channel. The polymer not entering/filling the channels may be advantageous. The polymer (or other infill material) may be used to bridge the channels, or to bridge trenches or to seal cavities. This may be achieved with the right combination of viscosity and spinning conditions/equipment. This can be achieved without filling the channels, trenches or cavities.

During the fabrication of structures having device suspended portions the ease with which the device suspended portion are released from the bulk of the material is a consideration. Should liquids, perhaps etchants used to free the device suspended portions from the bulk of the second material, be present in the channels stiction problems may occur wherein the device suspended portions stick to the bulk of the second material due to surface tension effects. It can be practically impossible to dry films of liquid between two closely spaced surfaces without stiction of the device suspended portions occurring.

The displacing of any liquid in the channels is therefore advantageous in that it reduces the stiction problems wherein the liquid causes the device suspended portions to stick to the bulk of the material. The infill material may subsequently be removed using a dry process so that surface tension stiction problems with the device suspended portions sticking to the bulk of the material are reduced (or possibly removed completely).

If the infill material is photosensitive (e.g. a photoresist) patterning of the infill material may simply comprise transferring a mask by lithography into the photosensitive layer and then developing that layer to remove unwanted area of the positive or negative photosensitive layer. The layer could be patterned by alternative means such as e-beam lithography, direct laser writing, screen printing. If the infill material is a polymer, or a polyimide a photoresist (photosensitive layer) may be applied on top of the infill material to allow it to be patterned and etched.

The method may comprise only removing portions of the infill material from the second material and leaving portions of the infill material remaining.

Firing in may be performed to, remove interface states between the primary region and the second material which it contacts to produce good ohmic contacts. Temperatures involved in the firing in process may damage photoresist and therefore prevent firing in being performed should photoresist be used as the infill material. Of course, the photoresist could be removed before the firing in is performed.

The material may be planarised, for example by spinning so that the polymer, polyimide or photoresist is planarised. It will be appreciated that by altering the parameters of spinning the liquid material can result in altering the thickness of the infill layer above the material. Alternatively, or additionally, the infill material may be polished using CMP (chemical mechanical polishing), or thinned using other techniques such as dry or wet etching.

The primary region may be deposited by sputter deposition, evaporation, CVD, MBE (molecular beam epitaxy). The primary region may be a metal. Once the primary region has been deposited it may be patterned and etched to form the desired structures. The skilled person will appreciate that material forming the primary region will be formed as a layer and may be micro-machined to have any desired structures therein as with a standard layer. For instance bond pads, etc. could be formed in the layer from which the primary region is formed.

The second material may be the material of a wafer utilised in the micro-machining method. In another possibility the second material is a material other than the material of the wafer.

Preferably the primary region contacts the second material at both ends. The region may contact second material at both ends or may contact a different material at each end. Perhaps one end of the region contacts second material and the other end of the region contacts a device suspended portion (which may be of a different material to the second material).

The region may be thought of as a wire, a strap, or a plate. The region may also form a micro-capacitor, or micro-inductor.

The method may comprise joining a conducting layer within a pre-formed integrated micro-electronic circuit or device to the primary region wherein the conducting layer is the second material.

According to a second aspect of the invention there is provided a method of narrowing micro-machined channels in a material comprising depositing a material in substantially only a top portion of the channel using plasma enhanced chemical vapour deposition (PECVD).

Preferably the method comprises sealing the channels at a top portion by depositing material.

The PECVD process occurs in a low pressure environment and therefore when the channel is filled it is at a low pressure. Thus when the low pressure is removed the channel remains at this low pressure because it has been sealed. It may be desirable to have channels sealed at a low pressure to form the basis of a technique for chip-level vacuum packaging.

According to a third aspect of the invention there is provided a method of micro-machining comprising providing a primary region of a first material contacting at at least one end thereof a second material wherein the second material is etched to form device suspended portions which are substantially free from the bulk of the second material with at least one channel separating the device suspended portion from the bulk of the second material wherein the primary region bridges at least one device suspended portion, said method comprising:

a. infilling said channel with an infill material;
b. patterning and etching said infill material to form a hole through the infill material to the second material;
c. depositing a primary region on to said infill material so that portions of the primary region contact the second material through the hole; and
d. removing said infill material.

There may be a plurality of channels.

The term device suspended portion may mean a portion of material, perhaps the second material, which has been undercut.

According to a fourth aspect of the invention there is provided a micro-mechanical device comprising a conductive track anchored at at least one end portion to a portion of the device and the track being freely suspended.

According to a fifth aspect of the invention there is provided a micro-machined device which comprises a channel which has been narrowed at a top portion

BRIEF DESCRIPTION OF THE DRAWINGS

There now follows by way of example only a detailed description of the invention with reference to the accompanying Figures of which.

DETAILED DISCUSSION OF EMBODIMENTS

Figure 1:
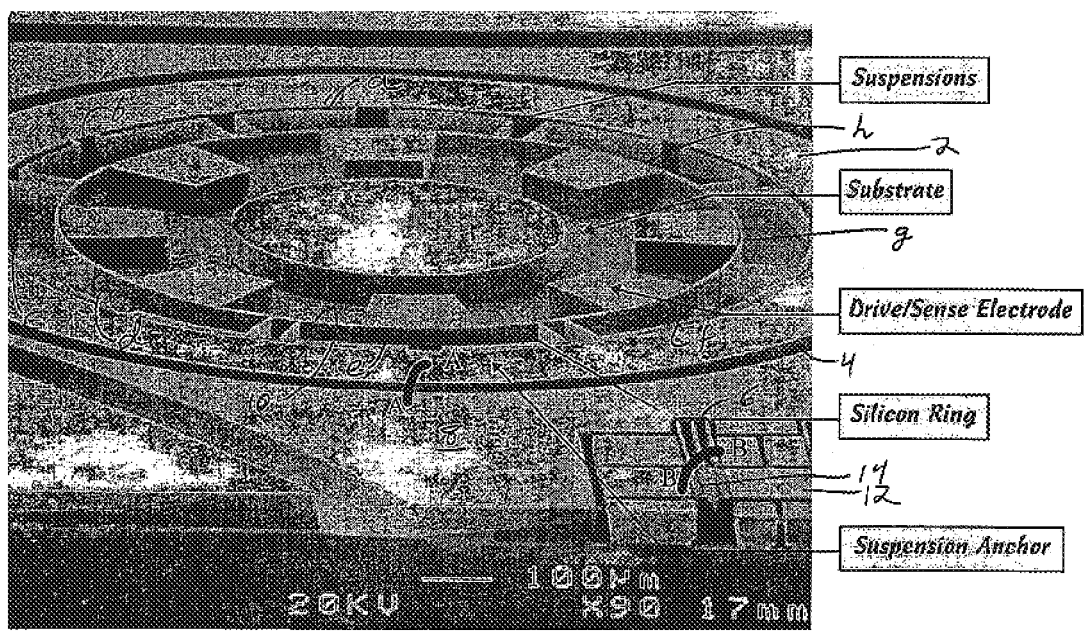
FIG. 1 shows a scanning electron micro graph of micromachined vibratory ring gyroscope having freely suspended tracks schematically shown thereon.

The gyroscope 2 of FIG. 1 comprises a number of channels (for example those referenced 4 and 6) etched into a surface portion of a substrate 8, which in this case is a silicon wafer. A ring 10 has also been fabricated into the silicon and is substantially freely suspended in the bulk of the substrate 8. The ring is a device suspended portion substantially free from the bulk of the substrate 8 having been undercut during its formation so that a bottom portion thereof is separated from the bulk of the substrate 8. The ring 10 is maintained in place on the substrate 8 by eight pairs of ligaments (a to h), which are connected to the ring 10 and to the bulk of the substrate 8.

There is also a comb resonator 12 provided in association with the gyroscope containing both channels and device suspended portions 14.

Two substantially freely suspended tracks (or primary region suspended portions) fabricated from in this case aluminium are shown in FIG. 1, that referenced AA and that referenced BB. Each end portion of the two tracks AA and BB is connected to the silicon substrate 8 (in this case a second material) with the remainder of the track being freely suspended above the silicon substrate 8.

The first of these tracks AA is shown passing over a channel 4 whereas the second track BB is shown bridging a device suspended portion 14. Like the ring of the gyroscope the device suspended portion 14 is substantially free from the bulk of the silicon substrate 8.

Figure 3:
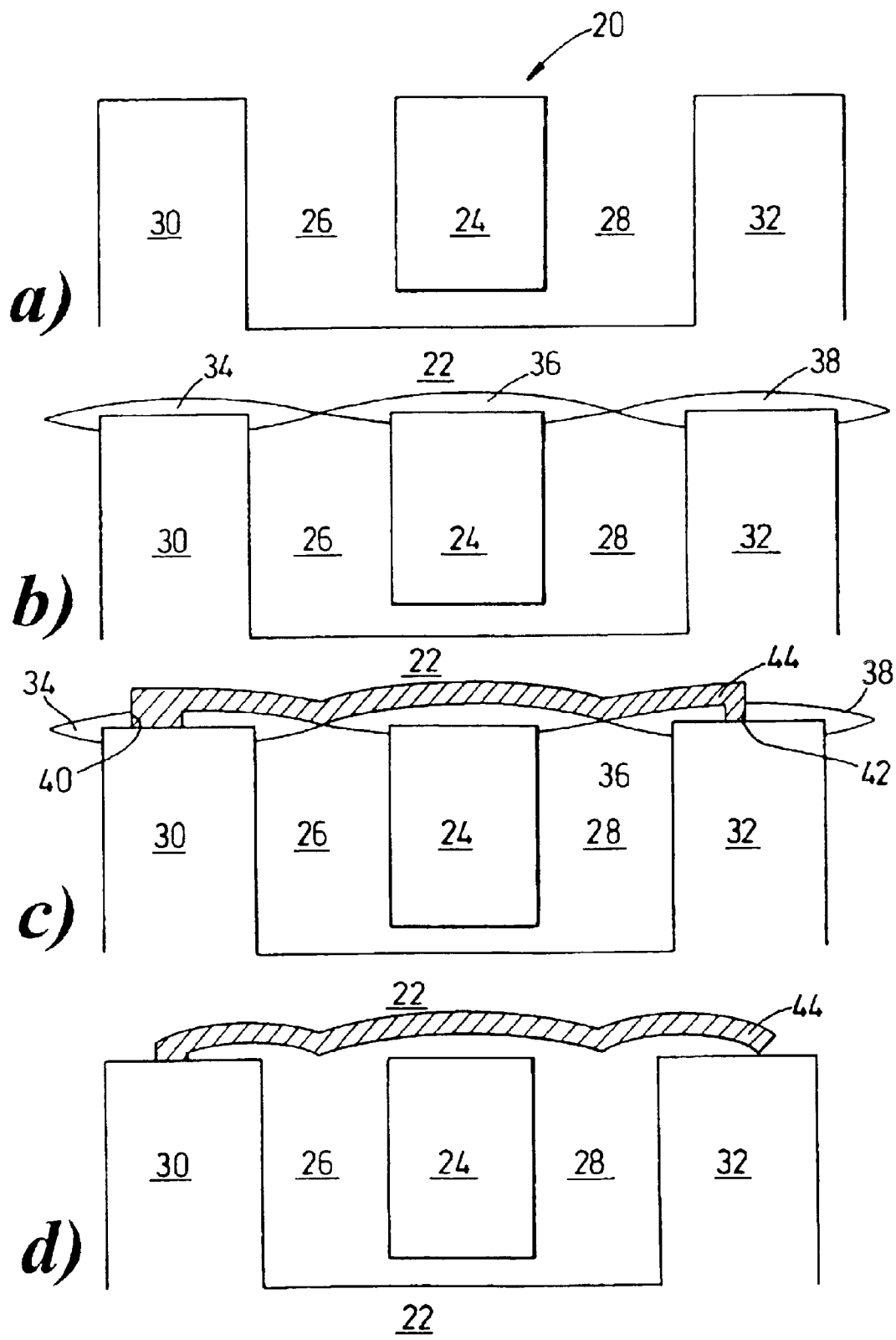
FIGS. 3a–3d schematically shows a process for fabricating a freely suspended track.

One process for fabricating the tracks of FIG. 1 is shown in FIGS. 3a to 3d. FIG. 3a shows a cross section through a device 20 fabricated into a surface portion of a silicon wafer 22. A device suspended portion 24 has been created which is substantially free from the remainder of the device. A supporting ligament (not shown) is provided connecting the device suspended portion to the remainder of the device 20. Two channels 26, 28 separate the device suspended portion 24 from ridges 30, 32 formed in the surface portion of the silicon wafer 22.

FIG. 3b shows the structure of FIG. 3a after end caps 34, 36, 38 of an infill material have been created on the prominent features of the device 20. These caps 34, 36, 38 are formed using a plasma enhanced chemical vapour deposition process wherein the plasma is created using a single frequency.

In such a process the material being deposited does not reach the bottom of the channels 26, 28 and collects at the top portions of the channels 26, 28 (that is on the top portions of the device suspended portion 24 and of the ridges 30, 32). It should be noted that there is some penetration into the channels and that this penetration may be increased using a dual frequency deposition process. Indeed, the channel may become substantially filled using a dual frequency process or it may only become partially filled. The deposited material spreads laterally across the channels 26, 28 until neighbouring caps meet at substantially central regions of the channels 26, 28. That is end cap 34 spreads to meet end cap 36 and end cap 36 spreads to meet end cap 38.

When the caps meet at the centre they continue to expand and eventually the channel is sealed. Because the deposition process is carried out at a low pressure the inside of the channel is sealed at this low pressure (assuming that the sealed portion of the channel is the only opening to the channel).

Once the infill material in this case $SiO_2$ has been deposited onto the device 20 it is patterned and etched using standard techniques. For example a photoresist is spun on to the top surface, a mask used to develop the photoresist in certain areas, the developed/undeveloped areas removed and infill layer etched using the remaining photoresist as a mask.

The mask used to pattern the photoresist allows holes to be created in the photoresist, and subsequently in the infill material, where it is desired to allow the primary regions to contact the second material, in this case silicon. Holes so created through the end caps 34, 36, 38 of the infill material are shown at 40, 42. Once the holes 40, 42 have been formed the photoresist is removed from the infill material.

Next a layer of first material (which in this case is a conductive material) is deposited onto the surface of the infill material. After the desired thickness of material has been deposited it is patterned and etched to form tracks of the desired shape and dimension. An example region or track is shown at 44 in FIG. 3c. The track 44 contacts the second material on a top portion of the ridge 32 via the hole 42 through the end cap 38, does not contact the second material in a region of the device suspended portion 24, but again contacts the second material on a top portion of the ridge 30 via the hole 40 through the end cap 34.

In the embodiment shown the track 44 is fabricated from TiW (but may also be fabricated from other CMOS process compatible metals such as Al, aluminium silicon (0%–5%), aluminium copper (0%–5%), aluminium silicon copper (0%–5%), Ti, Tungsten).

Once the track 44 has been etched to have the desired shape the infill material is removed, for example by using an etching process and the structure schematically shown in FIG. 3d results. As can be seen in FIG. 3d the track 44 does not contact the device suspended portion 24 but has its end portions are linked to the ridges 30, 32.

As the skilled person will appreciate the method described above can be used to bridge channels and device suspended portions and therefore could be used to connect parts of a circuit which would otherwise be unconnectable. It can also be used to provide structures suspended above the surface of the main wafer, not necessarily contacting the main wafer at both ends of the structure.

Figure 2:
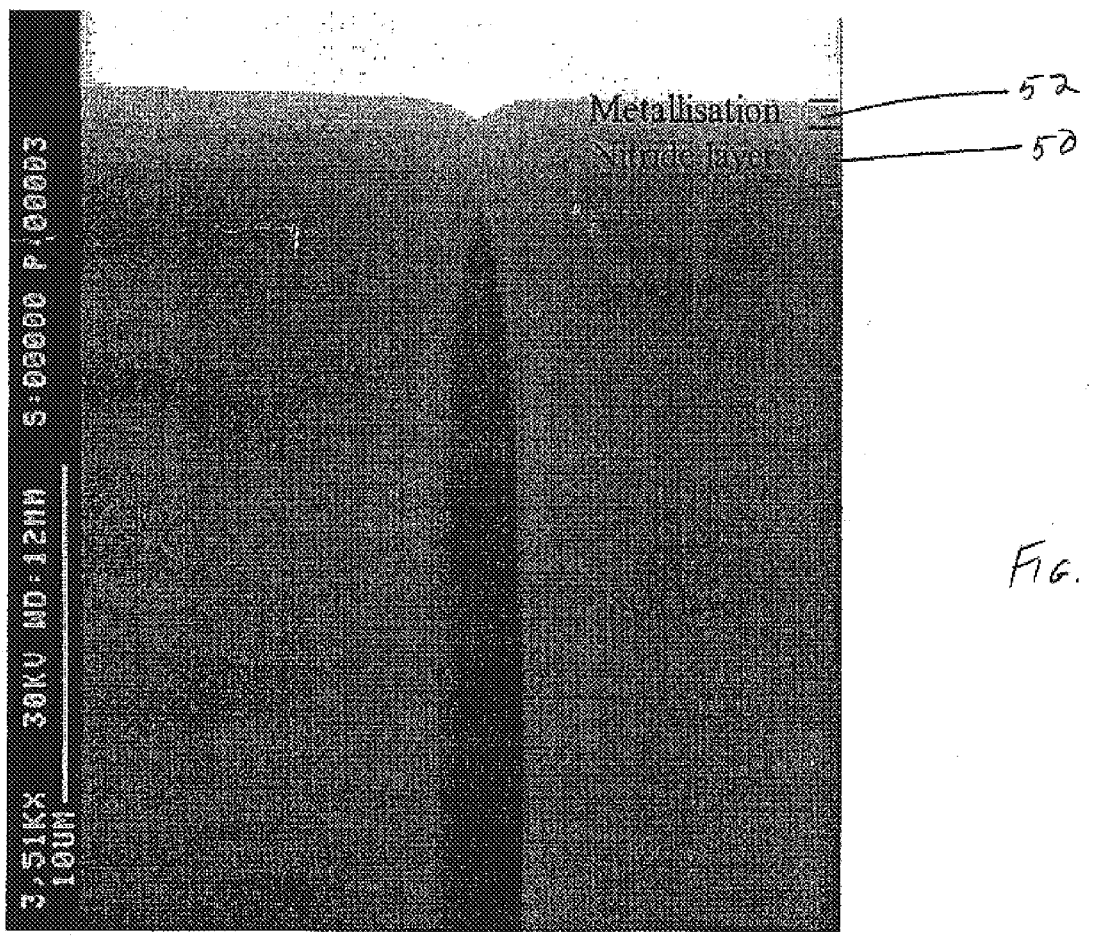
FIG. 2 shows a cross section through a channel between two portions of a material wherein the top portion of the channel has been sealed.

FIG. 2 shows an electron micrograph through two neighbouring portions of a second material separated by a channel (for example 24, 32 of FIG. 3) wherein a deposited infill material 50 (in this case a nitride) forms end caps thereon. The capping nature of the deposited infill material can be clearly seen. A layer of metalisation 52 has also been provided onto a top portion of the infill material 50. The sealed channel has an effective vacuum sealed therein because its inside was sealed during the PECVD process (or any other low pressure deposition process) which occurs at low pressure.

Figure 4:
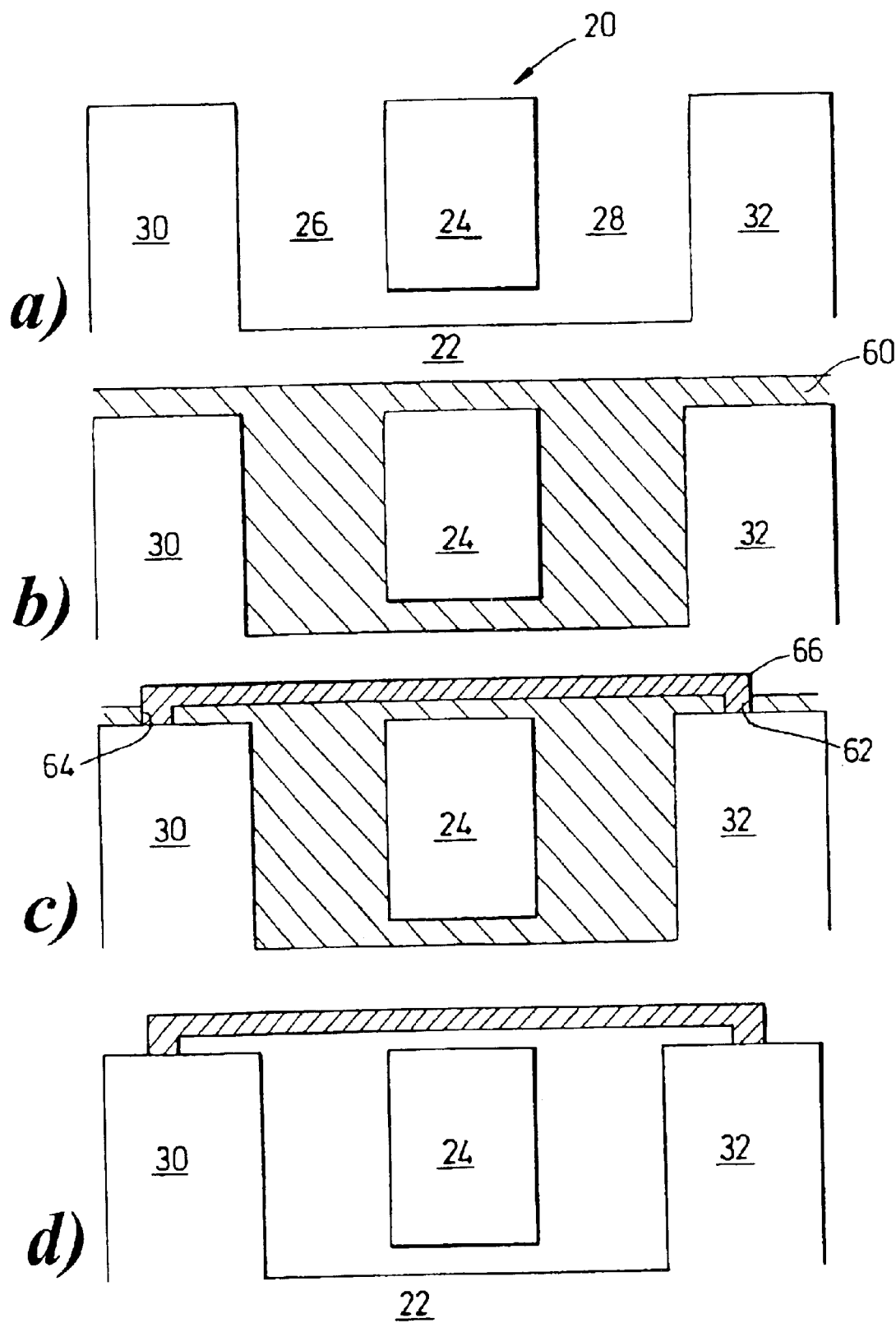
FIGS. 4a–4d schematically shows a further process flow for forming a freely suspended track.

An alternative process flow is shown in FIG. 4. However, for ease of reference like parts have like reference numerals applied. Before the steps are shown in FIG. 4 are carried out a sacrificial etch may be performed on the device to release device suspended portions. If this is the case it is beneficial to modify the process flow to better suit the process described in relation to FIG. 4.

The sacrificial etch may be performed by a wet etch such as by HF to remove sacrificial material holding the device suspended portions. This is advantageous in that it is highly selective between the insulating layer and wafers in a silicon on insulator structure (SOI) should an SOI structure be used. However, because this is a wet etch stiction problems occur due surface tension effects if the device/SOI structure is allowed to dry after the etch.

The SOI wafer may then be washed with water which dilutes the HF to minimal concentrations. The resultant liquid may then be displaced with acetone. Acetone is a also the solvent used for photoresist. A suitable alternative solvent as used in liquid polymer (for example PIQ™), could also be used as the final wet etch stage to displace the resultant liquid.

In this instance photoresist is flowed on to the device 20 and provides the infill material. If acetone has been used to wash an SOI structure the acetone draws the photoresist into the channels and under released device suspended portions since the acetone is a solvent of photoresist. The photoresist/polymer 60 enters the channels 26, 28 and flows around the device suspended portion 24. The photoresist then sets, or is made to solidify. The wafer from which the device is fabricated may be spun prior to setting to planarise the photoresist 60. The spinning process is controlled so that the photoresist has the desired thickness above the surface of the device 20. FIG. 4b shows the planarised polymer/photoresist.

The skilled person will appreciate that the viscosity of the polymer affects the flow of the polymer and subsequent planarisation. For example if the viscosity of the polymer is too low then it may not remain in the channels correctly. Yet if the viscosity is too high then it may not enter the channels during and prior to the planarisation process. This could be advantageous. With the right combination of viscosity and spinning conditions/equipment, the polymer may be used to bridge the channels, or to bridge trenches, or seal cavities.

Next, the polymer 60 is patterned and etched in much the same way as described in relation to FIG. 3c. The etching process creates holes 62, 64 through the polymer 60 which contact the second material in the region of the ridges 30, 32.

The skilled person will appreciate that in this example since the polymer is PIQ™ a layer of photoresist will be required on top of the layer of polymer 60 to allow the patterning and etching to be performed. However, if the polymer 60 were itself a photoresist, or photosensitive polyimide could be directly transferred on to the polymer 60 without the need to apply a further layer by lithography (or indeed, this may be the case if any photosensitive material is used).

If the infill material is spun on glass or other such material it could not be etched in the same way. However, spun on glass may be etched using HF and may be etched in the same step as the sacrificial etch. Indeed, the infill material may act as a sacrificial material. That is the infill material may join the bulk of a substrate (or other material) to a device suspended portion and an etch may be used to substantially remove the infill material thus releasing the device suspended portion.

Once the holes 62, 64 have been created a layer of metalisation is deposited on to a top surface, in this case by sputter deposition. The metal is then patterned and etched to form tracks 66 of the desired dimension as shown in FIG. 4c.

Once the metalisation has been etched as desired the polymer is removed using a dry etching process leaving the structure in FIG. 4d. It is advantageous to use a dry etching process so that no liquids occupy the channels between the device suspended portion 24 and the bulk of the second material or the ridges 30, 32 which may cause stiction problems preventing the device suspended portion 24 from moving relative to the remainder of the device 20.

If the tracks are relatively short they may be relatively stiff, that is stiff enough to resist external forces (for example acceleration deforming the structure). Should the tracks not be able to resist these forces stray capacitances of the system would alter as the track moved and also metal fatigue may be caused eventually causing the track to fail. A track length of substantially up to 1 mm may be suitable. The skilled person will appreciate that where track lengths are discussed this relates to the length of a freely suspended portion of a track (primary region suspended portion). The track may continue for much greater lengths but in close association with a substrate.

In some embodiments the infill material may be thinned using perhaps CMP, or an etching process. Indeed, the infill material may be thinned to completely remove it above a material to be contacted by the primary portion, exposing a further material. A hole may be created through the further material to the material to be contacted, allowing the primary portion to contact the material to be contacted. For example, a silicon substrate may be provided with an $SiO_2$ layer. An infill material of a polymer may be provided on top of the $SiO_2$ layer filling any channels as necessary. The polymer may then be thinned removing it from the $SiO_2$ layer (leaving it in the channels). The $SiO_2$ layer may then be patterned and etched such that a primary portion may contact the silicon substrate through the $SiO_2$ layer, but be supported over the channels by the polymer.

FIGS. 5 to 9 show various embodiments of the invention and like parts in those Figures are referenced by like reference numerals.

Figure 5:
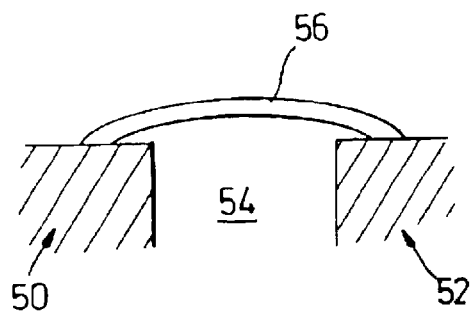
FIGS. 5 to 9 show schematically further embodiments of the invention.

FIG. 5 shows two portions of a substrate 50, 52 (or second material) which are separated by a channel 54 and connected by a primary region 56 of a first material which bridges the channel 54. In this embodiment the primary region is a conducting track of aluminium and the substrate 50, 52 is silicon.

Figure 6:
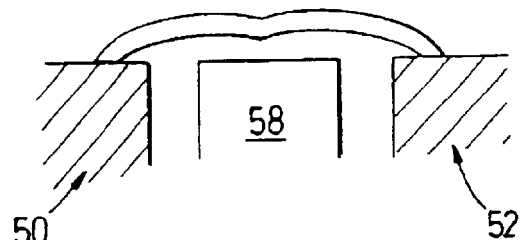

FIG. 6 shows two portions of substrate 50, 52 connected by a primary portion 56. In the embodiment shown in FIG. 6 the primary portion 56 also bridges a device suspended portion 58 which is substantially free from the substrate 50, 52. The device suspended portion 58 is maintained in place relative to the substrate 50, 52 by a linking portion (not shown). The device suspended portion may or may not be the same material as the substrate.

Figure 7:
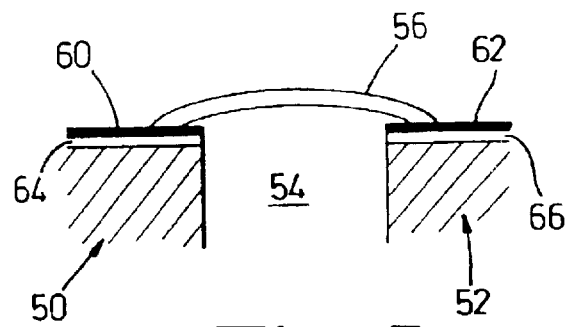

FIG. 7 shows an embodiment wherein the second material is an aluminium track 60, 62 provided in association with the substrate 50, 52. An insulating layer of $SiO_2$ 64, 66 is provided between the aluminium track 60, 62 and the substrate 50, 52.

Figure 8:
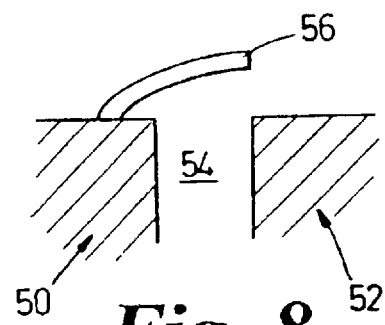

FIG. 8 shows another embodiment wherein only a single end portion of the primary region is connected to another structure.

Figure 9:
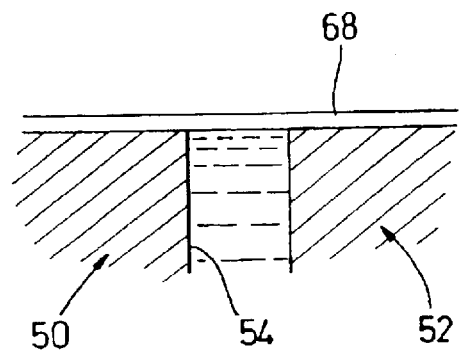

FIG. 9 shows a further embodiment wherein the channel 54 has been filled with an infill material using a low temperature process (wherein low temperature means that should an integrated micro-electronic device or circuit be provided then that circuit or device would not be destroyed or degraded by the process providing the infill material) and a primary portion 68 fabricated across the channel 54. In this embodiment the infill material has been left in place and has not been removed.

The skilled person will appreciate that in FIGS. 5 to 8 an infill material has been provided but that it has been removed. Further it will be appreciated that the embodiments of FIGS. 5 to 9 are merely examples and that combinations of the features shown in those Figures are possible.

What is claimed is:

1. A micro-machining method of bridging a channel with at least one bridging material, the channel being provided in a substrate comprising a second material and the method comprising the steps of:
   a) partially filling and completely covering said channel with an infill material at an uppermost region of said channel;
   b) patterning and etching said infill material to form a hole through the infill material to the second material; and
   c) depositing the at least one bridging material on to said infill material so that at least one portion of the at least one bridging material contacts the second material through the hole.

2. A method according to claim 1 comprising removing the infill material once the at least one bridging material has been provided leaving the at least one bridging material bridging said channel.

3. A method according to claim 2 comprising providing at least a portion of the at least one bridging material which is freely suspended above the second material.

4. A method according to claim 3 comprising micro-machining structures from a second material and creating at least one device suspended portion, which is substantially free from the bulk of the second material and providing at least one channel separating the device suspended portion from the bulk of the second material and providing the freely suspended portion of the at least one bridging material extending over the channel.

5. A method according to claim 4 comprising performing a sacrificial etch to release the device suspended portion from the bulk of the second material before the infill material is provided.

6. A method according to claim 4 or 5 comprising creating the freely suspended portion of the at least one bridging material extending over the device suspended portion.

7. A method according to claim 4 comprising performing a sacrificial etch to release the device suspended portion from the bulk of the substrate after the infill material is provided.

8. A method according to claim 7 in which the at least one bridging material is not substantially etched by the sacrificial etch.

9. A method according to claim 1 comprising depositing a conductive material as the at least one bridging material.

10. A method according to claim 1 wherein a plurality of bridging materials are used to bridge the channel.

11. A method according to claim 10 comprising providing a supporting layer and one or more conductive layers within the bridge over the channel.

12. A method according to claim 1 which comprises depositing the infill material using Plasma Enhanced Chemical Vapour Deposition (PECVD).

13. A method according to claim 1 which comprises depositing one of the following materials as the infill layer: an oxide, a nitride, an oxynitride, polysilicon.

14. A method according to claim 1 which comprises using a dual frequency PECVD system to deposit the infill material wherein the plasma is generated at a first frequency and species accelerated toward the second material at a second frequency.

15. A method according to claim 1 which causes the infill material to expand laterally across the channel.

16. A method according to claim 1 comprising causing the deposited material to cap the channel sealing the channel at the top region.

17. A method according to claim 2 which comprises using an etching process to remove the infill material.

18. A method according to claim 4 which comprises using any one of the following for the infill material: a polymer material, a polyimide, a photoresist, PIQ™, spin on glass, or other spin on di-electric.

19. A method according to claim 18 which comprises flowing the infill material so that it flows into the channel.

20. A method according to claim 18 which comprises using a dry etching process to remove the infill material.

21. A method according to claim 1 which comprises using a photoresist as the infill material and further comprises using a mask to develop the photoresist and then etching the mask to remove portions of photoresist.

22. A method according to claim 1 which comprises using a polyimide as the infill material and subsequently applying a photoresist on top of the infill material to allow the infill material to be patterned and etched.

23. A micro-machining method of bridging a channel with at least one bridging material, the channel being provided in a substrate comprising a second material and the method comprising the steps of:
   a) at least partially filling said channel with an infill material at an uppermost region of said channel;
   b) patterning and etching said infill material to form a hole through the infill material to the second material; and
   depositing the at least one bridging material on to said infill material so that at least one portion of the at least one bridging material contacts the second material through the hole.

* * * * *